(12) United States Patent
Mishima et al.

(10) Patent No.: US 9,261,802 B2
(45) Date of Patent: Feb. 16, 2016

(54) LITHOGRAPHY APPARATUS, ALIGNMENT METHOD, AND METHOD OF MANUFACTURING ARTICLE

(71) Applicant: CANON KABUSHIKI KAISHA, Tokyo (JP)

(72) Inventors: Kazuhiko Mishima, Utsunomiya (JP); Shinichiro Koga, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/456,192

(22) Filed: Aug. 11, 2014

(65) Prior Publication Data

US 2015/0049317 A1    Feb. 19, 2015

(30) Foreign Application Priority Data

Aug. 13, 2013   (JP) ................................ 2013-168334

(51) Int. Cl.
| | |
|---|---|
| *G03B 27/54* | (2006.01) |
| *G03B 27/42* | (2006.01) |
| *G03F 9/00* | (2006.01) |
| *G03F 7/20* | (2006.01) |
| *G03F 7/00* | (2006.01) |

(52) U.S. Cl.
CPC ............ *G03F 9/7042* (2013.01); *G03F 7/0002* (2013.01); *G03F 7/70141* (2013.01)

(58) Field of Classification Search
CPC ........................... G03F 7/70141; G03F 9/7042
USPC ................... 355/52, 53, 55, 67; 356/399–401
See application file for complete search history.

(56) References Cited

U.S. PATENT DOCUMENTS

| | | | |
|---|---|---|---|
| 5,272,501 A * | 12/1993 | Nishi et al. ..................... 355/53 |
| 5,521,036 A * | 5/1996 | Iwamoto et al. ................ 430/22 |
| 5,668,042 A | 9/1997 | Bae | |
| 6,686,107 B2 | 2/2004 | Matsumoto et al. | |
| 2009/0147237 A1 | 6/2009 | Schumaker et al. | |
| 2011/0278768 A1 | 11/2011 | Sato | |
| 2013/0134616 A1* | 5/2013 | Sato ............................ 264/40.5 |

FOREIGN PATENT DOCUMENTS

| | | |
|---|---|---|
| CN | 101059650 A | 10/2007 |
| CN | 101884093 A | 11/2010 |

(Continued)

OTHER PUBLICATIONS

Office Action issued in CN201410398286.3, mailed Dec. 11, 2015. English translation provided.

*Primary Examiner* — Hung Henry Nguyen
(74) *Attorney, Agent, or Firm* — Rossi, Kimms & McDowell LLP

(57) ABSTRACT

The present invention provides a lithography apparatus for transferring a pattern formed on an original to each of a plurality of shot regions on a substrate, comprising a detection unit configured to detect a mark provided in the shot region and a mark provided on the original, and a control unit configured to control alignment between a target shot region and the pattern of the original such that the mark in the target region detected by the detection unit and the mark on the original are shifted by a positional shift amount which is generated between each mark in the shot region and each mark on the original when an overlay error between the shot region and the pattern of the original falls within an allowable range.

12 Claims, 11 Drawing Sheets

(56) References Cited

FOREIGN PATENT DOCUMENTS

| | | |
|---|---|---|
| CN | 102156392 A | 8/2011 |
| CN | 103135340 A | 6/2013 |
| JP | 11195591 A | 7/1999 |
| JP | 2002-196476 A | 7/2002 |
| JP | 4185941 B2 | 11/2008 |
| JP | 2013-042148 A | 2/2013 |
| JP | 2013-138175 A | 7/2013 |
| TW | 322630 B | 12/1997 |

* cited by examiner

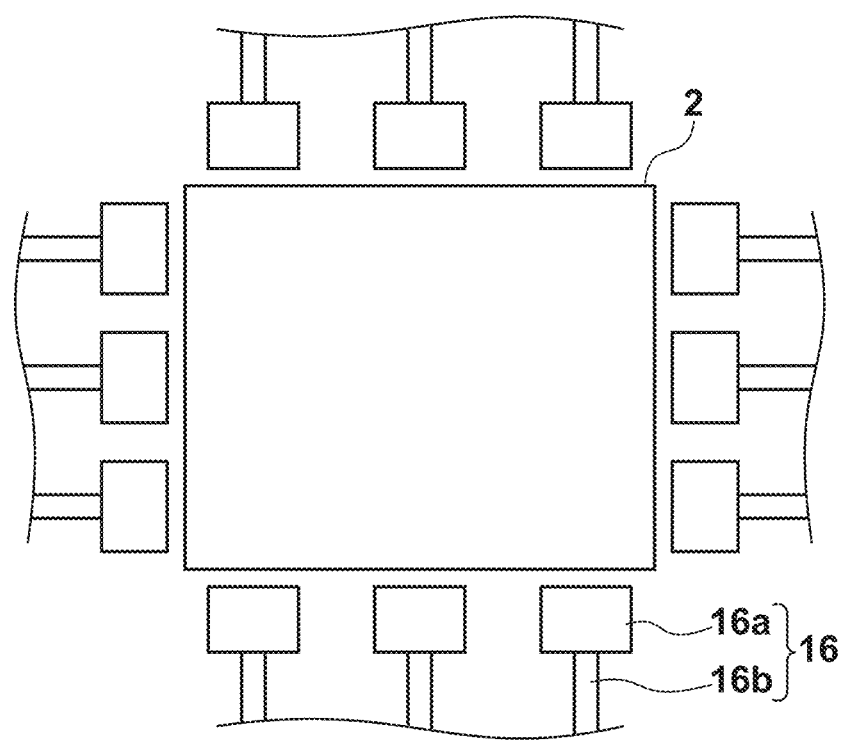

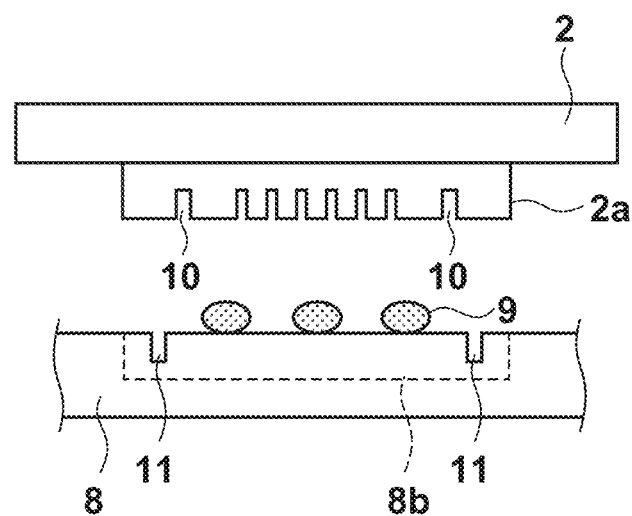
F I G. 3A
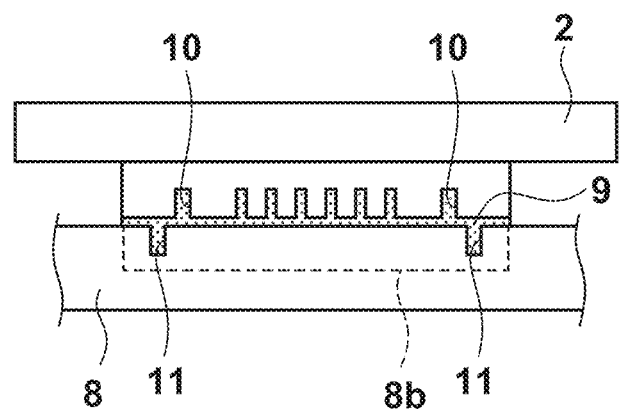
F I G. 3B
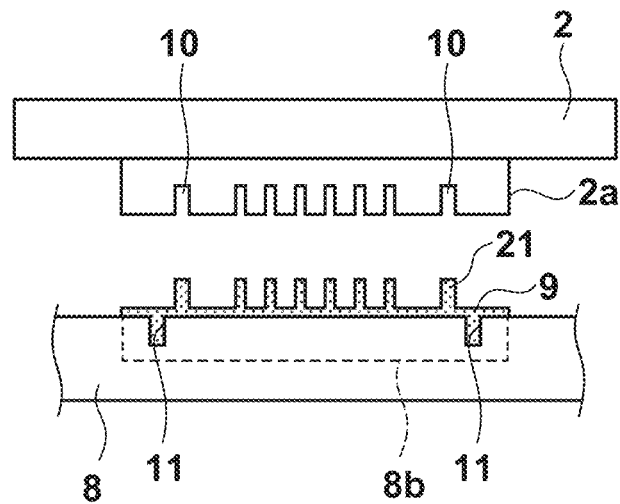
F I G. 3C

FIG. 9
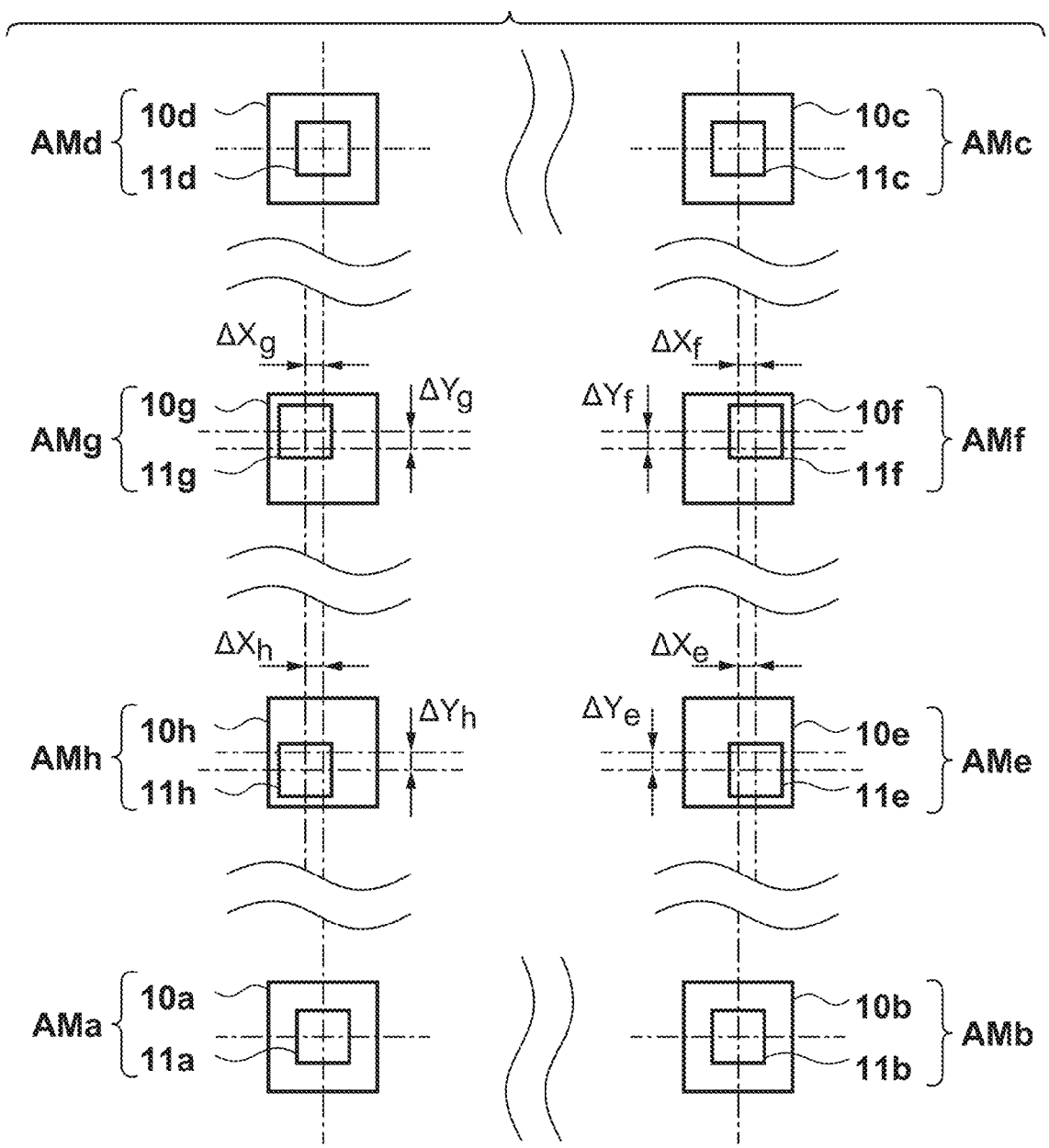
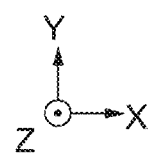

LITHOGRAPHY APPARATUS, ALIGNMENT METHOD, AND METHOD OF MANUFACTURING ARTICLE

BACKGROUND OF THE INVENTION

1. Field of the Invention

The present invention relates to a lithography apparatus, an alignment method, and a method of manufacturing an article.

2. Description of the Related Art

As a lithography apparatus used to manufacture a semiconductor device or the like, an imprint apparatus that transfers a pattern formed on a mold serving as an original onto a substrate has received a great deal of attention, in addition to an exposure apparatus that projects the pattern of a mask serving as an original onto a substrate. In the imprint apparatus, a mold with a pattern formed on it and an imprint material supplied onto a substrate are brought into contact with each other, and the imprint material is cured in that state. The mold is separated from the cured imprint material, thereby transferring the pattern of the mold onto the substrate.

In the manufacture of a semiconductor device or the like, a step of overlaying a plurality of patterns on one substrate is necessary. For this reason, in the imprint apparatus, it is important to accurately transfer the pattern of a mold to a shot region formed on the substrate. Japanese Patent No. 4185941 proposes an imprint apparatus that employs a die-by-die alignment method as an alignment method when transferring the pattern of a mold to a shot region. The die-by-die alignment method is an alignment method of detecting marks formed in a shot region and marks formed in a mold and correcting the shift between a substrate and the mold for each shot region on the substrate.

The plurality of marks formed in the shot region sometimes individually have positional shifts due to, for example, manufacturing errors of an original used in the preceding lithography process, deformation of the marks or deformation of the entire substrate caused by a semiconductor process, and the like. In this case, when alignment between the shot region and the pattern of the original is performed based on the detection result of the marks without considering the positional shifts of the marks in the shot region, it may be difficult to accurately transfer the pattern of the original to the shot region.

Japanese Patent Laid-Open No. 2002-196476 proposes a method of aligning a shot region and an original considering manufacturing errors included in the relative positions of the pattern on the original and alignment marks on the original. In the method described in Japanese Patent Laid-Open No. 2002-196476, however, positional shifts that individually occur in the marks formed in the shot region are not taken into consideration.

SUMMARY OF THE INVENTION

The present invention provides a technique advantageous in, for example, accurately transferring the pattern of an original to a shot region formed on a substrate.

According to one aspect of the present invention, there is provided a lithography apparatus for transferring a pattern formed on an original to each of a plurality of shot regions on a substrate, comprising: a detection unit configured to detect a mark provided in the shot region and a mark provided on the original; and a control unit configured to control alignment between the shot region and the pattern of the original based on a detection result of the detection unit, wherein the control unit obtains, from information representing a positional shift amount generated between each mark in the shot region and a corresponding mark on the original when an overlay error between the shot region and the pattern of the original falls within an allowable range, the positional shift amount in a mark to be detected by the detection unit out of a plurality of marks provided in a target shot region to which the pattern of the original is to be transferred, and controls alignment between the target shot region and the pattern of the original such that the mark in the target shot region detected by the detection unit and the mark on the original corresponding to the mark are shifted by the obtained positional shift amount.

Further features of the present invention will become apparent from the following description of exemplary embodiments with reference to the attached drawings.

BRIEF DESCRIPTION OF THE DRAWINGS

FIG. 2 is a view showing the arrangement of a deformation unit;

FIG. 3A is a view for explaining imprint processing of the imprint apparatus according to the first embodiment;

FIG. 3B is a view for explaining imprint processing of the imprint apparatus according to the first embodiment;

FIG. 3C is a view for explaining imprint processing of the imprint apparatus according to the first embodiment;

FIG. 9 is a view showing alignment marks in a shot region;

DESCRIPTION OF THE EMBODIMENTS

Figure 1A:
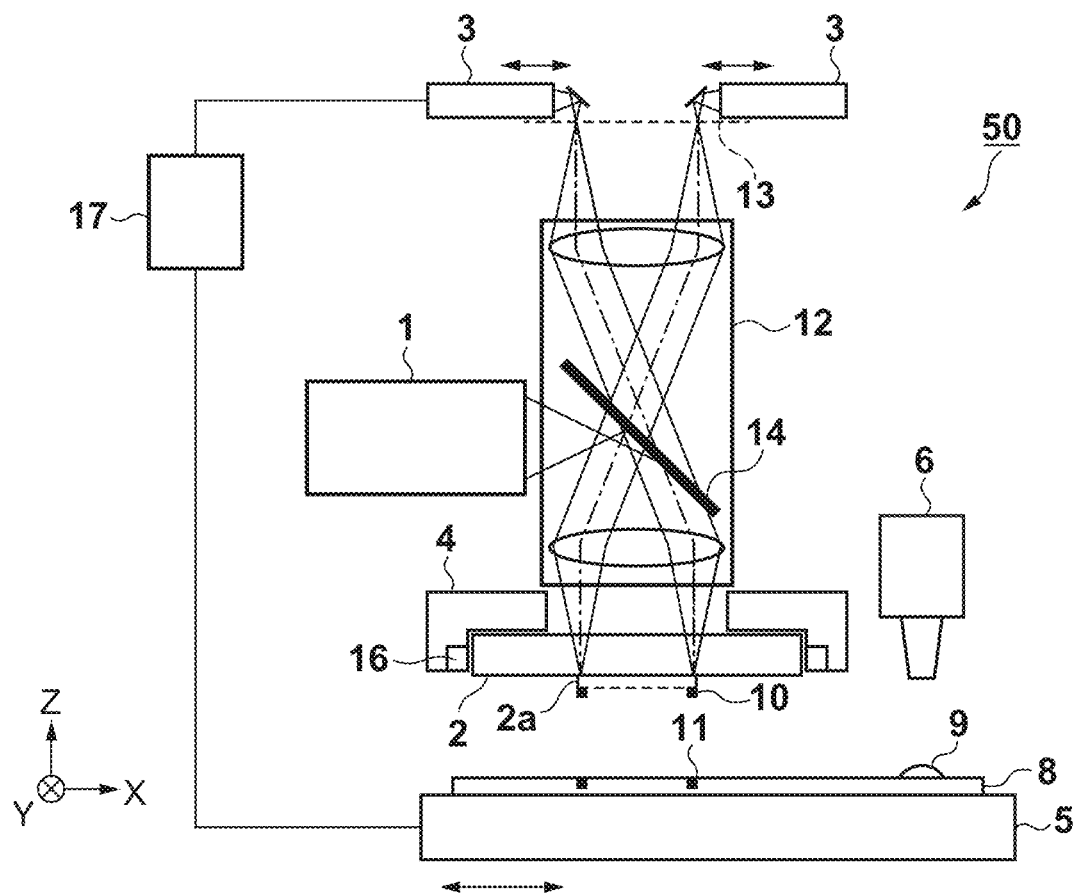
FIG. 1A is a view showing the arrangement of an imprint apparatus according to the first embodiment.

Exemplary embodiments of the present invention will be described below with reference to the accompanying drawings. Note that the same reference numerals denote the same members throughout the drawings, and a repetitive description thereof will not be given.

First Embodiment

In the first embodiment, an example in which an imprint apparatus is used as a lithography apparatus will be described. FIG. 1A is a view showing the arrangement of an imprint apparatus 50 according to the first embodiment. The imprint apparatus 50 is a lithography apparatus used in the manufacturing process of a semiconductor device or the like. The imprint apparatus 50 performs imprint processing of curing an imprint material on a substrate in a state in which a mold 2 (original) with a pattern formed on it is in contact with the imprint material and separating the mold 2 from the cured imprint material, thereby transferring the pattern onto the substrate. In the imprint apparatus 50 according to the first embodiment, a UV curing resin 9 that cures when irradiated with ultraviolet rays is used as the imprint material, and a photo-curing method of curing the imprint material by irradiation of ultraviolet rays is employed. The imprint apparatus 50 includes a mold holding portion 4 that holds the mold 2, a substrate holding portion 5 that holds a substrate 8, an irradiation unit 1 that emits ultraviolet rays, a projection optical system 12, a detection unit 3, a control unit 17, and a resin supply unit 6 that supplies the resin 9 onto the substrate.

The mold 2 has a pattern portion 2a in which a pattern to be transferred onto the substrate 8 (resin 9 supplied onto the substrate) is three-dimensionally formed. The mold 2 is made of a material (for example, quartz) capable of passing ultraviolet rays used to cure the resin on the substrate. A plurality of alignment marks (to be referred to as mold-side marks 10 hereinafter) are formed on the mold 2 (pattern portion 2a).

The mold holding portion 4 can include a mold chuck that holds the mold 2 by vacuum chuck or electrostatic chuck, and a mold driving unit that drives the mold chuck. The mold driving unit drives the mold chuck (that is, mold) at least in the Z direction (direction (imprint direction) in which the mold 2 is imprinted in the resin 9 on the substrate). The mold driving unit may have a function of driving the mold chuck not only in the Z direction but also in the X direction, Y direction, and θ direction (rotational direction about the Z axis). The shape of the pattern portion 2a of the mold 2 may be different from the target shape due to manufacturing errors, thermal deformation, or the like. To cope with this, the mold holding portion 4 includes a deformation unit 16 that deforms the pattern portion 2a by applying forces to a plurality of points of the side surfaces of the mold 2. FIG. 2 is a view showing the arrangement of the deformation unit 16. As shown in FIG. 2, the deformation unit 16 includes a plurality of chuck portions 16a that chuck the side surfaces of the mold 2, and a plurality of actuators 16b that apply forces to the side surfaces of the mold 2 via the chuck portions 16a. When the deformation unit 16 applies forces to the plurality of points of the side surfaces of the mold 2, the mold 2 can be deformed such that the pattern portion 2a obtains a shape close to the target shape. The deformation unit 16 may apply heat to the mold 2 so as to deform it such that the pattern portion 2a obtains a shape close to the target shape.

The substrate 8, onto which the pattern of the mold 2 is to be transferred, includes, for example, a single-crystal silicon substrate or an SOI (Silicon On Insulator) substrate. The resin supply unit 6 (to be described later) supplies the resin onto the substrate 8. A plurality of shot regions 8a are formed on the substrate. A plurality of alignment marks (to be referred to as substrate-side marks 11 hereinafter) are formed in each shot region 8a.

The substrate holding portion 5 can include a substrate chuck that holds the substrate 8 by vacuum chuck or electrostatic chuck, and a substrate driving unit that drives the substrate chuck. The substrate driving unit drives a substrate stage (that is, substrate 8) at least in the X direction and Y direction (directions perpendicular to the imprint direction). The substrate driving unit may have a function of driving the substrate stage not only in the X direction and Y direction but also in the Z direction and θ direction (rotational direction about the Z axis).

The projection optical system 12 is arranged above the mold 2, and projects the images of the mold-side marks 10 and the images of the substrate-side marks 11 onto a projection plane 13 of the projection optical system 12. The projection optical system 12 includes a beam splitter 14. The beam splitter 14 is an optical member that selectively reflects or passes light depending on its wavelength, and is designed to, for example, reflect ultraviolet rays for curing the resin 9 and pass light (visible light or infrared rays) used to illuminate the mold-side marks 10 and the substrate-side marks 11. For example, a dichroic mirror or a dichroic prism is used as the beam splitter 14.

The irradiation unit 1 emits ultraviolet rays to cure the resin supplied onto the substrate 8. In the first embodiment, the irradiation unit 1 is arranged on a side of the projection optical system 12, and irradiates the beam splitter 14 of the projection optical system 12 with light. The light reflected by the beam splitter 14 irradiates the pattern portion 2a in a predetermined shape. The detection unit 3 is arranged above the projection optical system 12. The detection unit 3 illuminates the mold-side marks 10 and the substrate-side marks 11 via the projection optical system 12, and observes the images of the mold-side marks 10 and the images of the substrate-side marks 11 projected onto the projection plane 13 of the projection optical system 12. The detection unit 3 can thus detect the relative positions of the mold-side marks 10 and the substrate-side marks 11. The detection unit 3 may be unable to detect the mold-side marks 10 and the substrate-side marks 11 simultaneously. For example, the detection unit 3 may individually obtain the positions of the mold-side marks 10 and the substrate-side marks 11 relative to a reference position set in the detection unit 3, thereby detecting their relative positions.

Figure 1B:
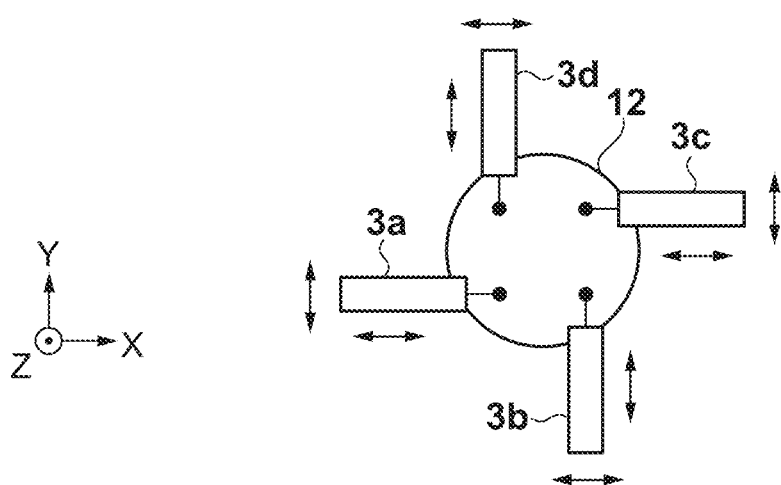
FIG. 1B is a schematic view showing a detection unit viewed from the upper side of the apparatus.

FIG. 1B is a schematic view showing the detection unit 3 viewed from the upper side of the apparatus. In the first embodiment, four detection units 3a to 3d are arranged above the projection optical system 12. Each of the four detection units 3a to 3d is configured to observe the substrate-side mark 11 formed in the shot region 8a together with the mold-side mark 10. For this reason, out of the plurality of substrate-side marks 11 formed in the shot region 8a, four substrate-side marks 11 can simultaneously be observed using the four detection units 3a to 3d. The detection units 3a to 3d are configured to be individually movable in the XY direction (planar direction parallel to the surface of the substrate). For this reason, even when the positions of the substrate-side marks 11 to be detected by the detection units 3a to 3d change because of a change in the shape of the shot region 8a, it is possible to individually move the detection units 3a to 3d in the XY direction and detect the substrate-side marks 11, as will be described later.

The control unit 17 includes a CPU and a memory, and controls the entire imprint apparatus 50 (units of the imprint apparatus 50). In the first embodiment, the control unit 17 controls imprint processing and processing associated with it. For example, when performing imprint processing, the control unit 17 controls alignment between the mold 2 and the substrate 8 based on the detection result of the detection unit 3. In addition, when performing imprint processing, the control unit 17 controls the deformation unit 16 such that the pattern portion 2a of the mold 2 obtains a shape close to the target shape.

The resin supply unit 6 supplies (coats) the imprint material onto the substrate. As described above, in the first embodiment, the UV curing resin 9 that cures when irradiated with ultraviolet rays as its nature is used as the imprint material. The resin 9 to be supplied from the resin supply unit 6 onto the substrate can appropriately be selected in accordance with various conditions in the manufacturing process of a semiconductor device. The amount of the resin to be discharged from the resin supply unit 6 can appropriately be decided in consideration of the thickness or density of the pattern to be formed in the resin on the substrate.

Imprint processing of the imprint apparatus 50 according to the first embodiment having the above-described arrangement will be described with reference to FIGS. 3A to 3C. As shown in FIG. 3A, the control unit 17 causes the resin supply unit 6 to supply the resin 9 to a target shot region 8b to which the pattern of the mold 2 is to be transferred. Since the resin 9 (imprint material) generally used is volatile, it is supplied to the target shot region 8b immediately before imprint processing. If the volatility of the resin 9 is low, the resin 9 may be coated to the entire substrate surface in advance by spin coating. When the resin 9 is supplied to the target shot region 8b, the control unit 17 causes the detection unit 3 to detect the relative positions of the substrate-side marks 11 and the mold-side marks 10, and aligns the target shot region 8b with the pattern of the mold 2. The alignment is done by, for example, causing the deformation unit 16 to deform the pattern portion 2a or causing the substrate driving unit to adjust the position of the substrate 8.

After aligning the target shot region 8b and the pattern of the mold 2, the control unit 17 controls the mold driving unit to move the mold 2 in the −Z direction and bring the pattern portion 2a of the mold 2 into contact with the resin 9 on the substrate, as shown in FIG. 3B. At this time, an elapse of a predetermined time is waited in the state in which the pattern portion 2a is in contact with the resin 9. The resin 9 supplied onto the substrate can thus sufficiently fill the pattern of the mold 2. When the mold 2 is made of a transparent material such as quartz, and the refractive index difference between the mold 2 and the resin 9 is small, the detection unit 3 may be unable to detect the mold-side marks 10 formed in a three-dimensional pattern in the state in which the mold 2 and the resin 9 are in contact. In this case, a substance whose refractive index or transmittance is different from that of the mold 2 may be coated to the mold-side marks 10. This makes it possible to change the refractive index of the mold-side marks 10 and cause the detection unit 3 to detect the mold-side marks 10 even in the state shown in FIG. 3B.

When the predetermined time has elapsed in the state in which the pattern portion 2a and the resin 9 are in contact, the control unit 17 causes the irradiation unit 1 to irradiate the resin 9 on the substrate with light via the mold 2. The control unit 17 controls the mold driving unit to move the mold 2 in the +Z direction and separate the mold 2 from the resin 9 on the substrate. The pattern of the mold 2 can thus be transferred to the target shot region 8b, as shown in FIG. 3C. In the target shot region 8b, the mold-side marks 10 are also transferred together with the pattern of the mold 2 to form transferred marks 21.

Figure 4:
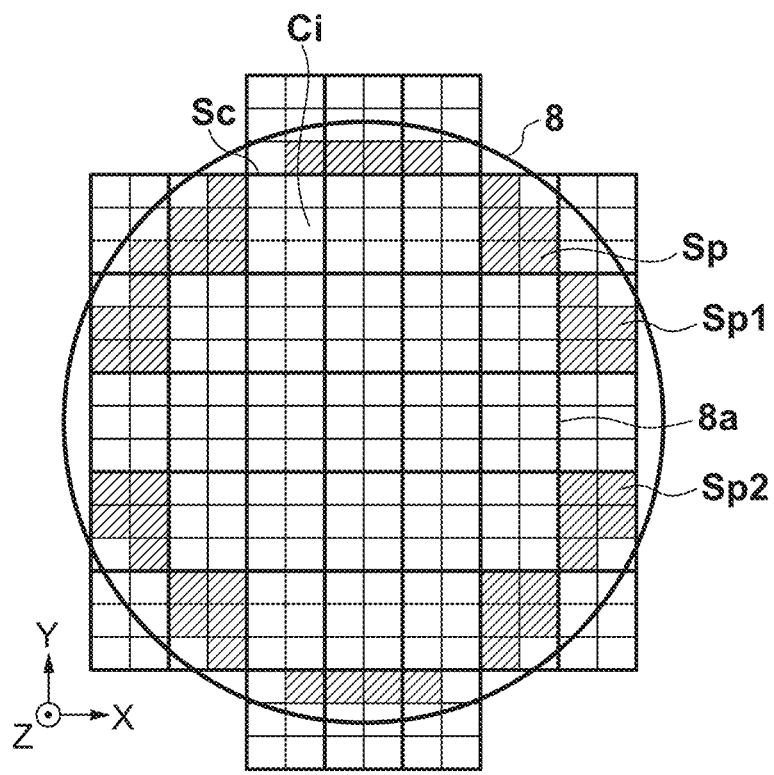
FIG. 4 is a view showing a substrate on which a plurality of shot regions are formed.

The plurality of shot regions 8a arranged on the substrate 8 in the imprint apparatus 50 having the above-described arrangement will be described next. FIG. 4 is a view showing the substrate 8 on which the plurality of shot regions 8a are formed. Referring to FIG. 4, rectangles indicated by thick lines represent the shot regions 8a, and rectangles indicated by thin lines represent chip areas Ci. A plurality of chip areas Ci (six chip areas in the first embodiment) are formed in each shot region 8a. In recent years, even when only one chip area Ci is included in a shot region arranged in the peripheral portion of the substrate 8, the pattern of the mold 2 is required to be transferred to the chip area Ci to raise the yield of chip areas Ci available from one substrate 8. It is therefore necessary to accurately align the chip area Ci and the mold 2.

The shot regions 8a arranged in the peripheral portion of the substrate 8 include the periphery of the substrate, and are therefore formed on the substrate 8 while being partially lost. The shot region 8a including at least one chip area Ci and partially lost when arranged in the peripheral portion of the substrate 8 will be referred to as a partial shot Sp (second shot region) hereinafter. On the other hand, the shot region 8a including all chip areas Ci and formed on the substrate 8 into the same shape as the pattern of the mold 2 without being partially lost will be referred to as a complete shot Sc (first shot region) hereinafter. Referring to FIG. 4, the shot regions 8a in which all six chip areas Ci are represented by open rectangles indicate the complete shots Sc. The shot regions 8a in which at least one chip area Ci is hatched indicate the partial shots Sp. The hatched chip area Ci indicates an area (valid chip area) as a prospective chip that forms a product without including the periphery of the substrate 8. The shot region 8a having the same shape as the pattern of the mold 2 means not a shot region having the same outer shape but a shot region including a region where the entire pattern of the mold 2 is to be transferred.

Figure 5:
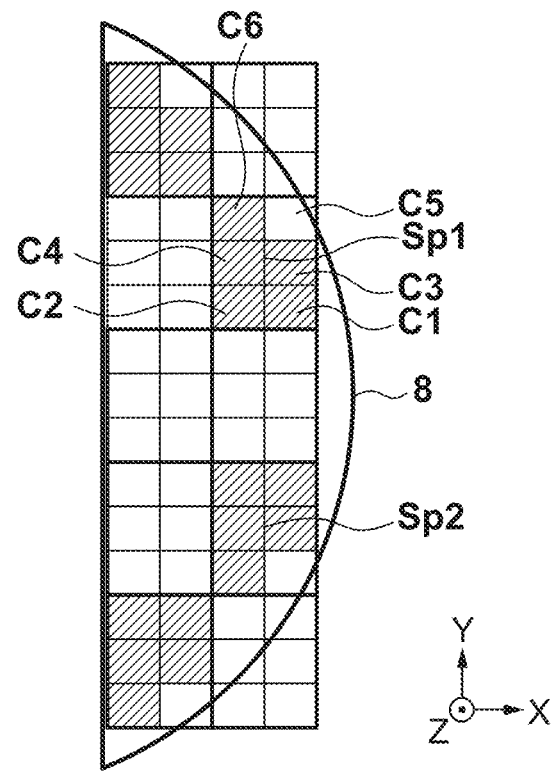
FIG. 5 is a view showing partial shots.

Valid chip areas in the partial shot Sp will be described with reference to FIG. 5. FIG. 5 is a view showing partial shots Sp1 and Sp2 shown in FIG. 4. In the partial shot Sp1, chip areas C1 to C4 and C6 except a chip area C5 are valid chip areas. On the other hand, in the partial shot Sp2, the chip areas C2 to C6 except the chip area C1 are valid chip areas. As described above, the arrangement of the valid chip areas in the partial shot Sp changes depending on the arrangement position of the partial shot on the substrate.

Figure 6:
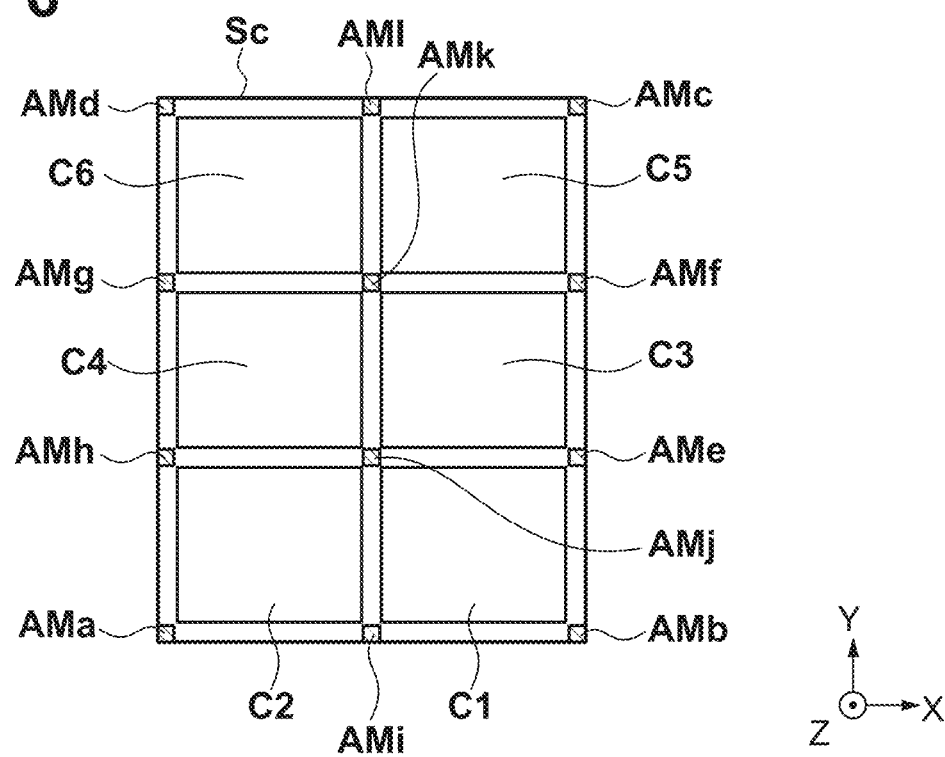
FIG. 6 is a view showing the arrangement of a plurality of chip areas and substrate-side marks formed in one complete shot.

The arrangement of the six chip areas Ci and the substrate-side marks 11 formed in one shot region 8a will be described next with reference to FIG. 6. FIG. 6 is a view showing the arrangement of the plurality of (six) chip areas Ci and the substrate-side marks 11 formed in one complete shot Sc. As shown in FIG. 6, scribe lines used to cut the chip areas Ci are provided between the plurality of chip areas in the shot region 8a. A plurality of alignment marks AMa to AMl are provided on the scribe lines in correspondence with the four corners of each chip area Ci. Each of the alignment marks AMa to AMl is defined to be formed by overlaying the mold-side mark 10 on the substrate-side mark 11. In this way, the plurality of alignment marks AMa to AMl are provided for one shot region. For this reason, even when the number or positions of valid chip areas in the shot region changes, alignment marks to be detected by the detection unit can be selected in accordance with the number or positions of valid chip areas.

Figure 7:
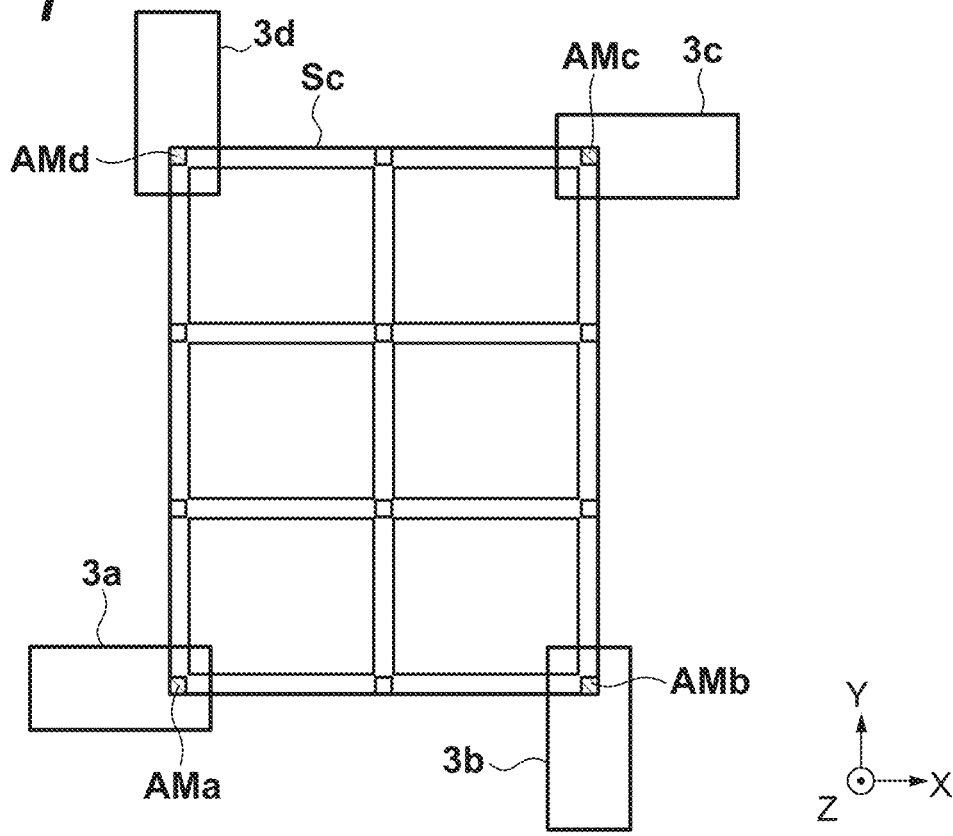
FIG. 7 is a view for explaining alignment between a complete shot and a mold.

Alignment with the mold 2 in the complete shot Sc and the partial shot Sp will be described with reference to FIGS. 7 and 8. FIG. 7 is a view for explaining alignment between the complete shot Sc and the mold 2 (pattern portion 2a). In the complete shot Sc, since the whole shot region 8a is formed on the substrate 8, the alignment marks AMa to AMd are selected as alignment marks to be detected by the detection unit 3. The alignment marks to be detected by the detection unit 3 are selected such that the distances between the alignment marks become long. This is because such alignment mark selection makes it possible to accurately detect components such as the magnification component and the rotation component of the shot region 8a. The control unit 17 arranges the detection units 3a to 3d at positions where the selected alignment marks AMa to AMd can be detected, respectively, and causes the detection units 3a to 3d to detect the alignment marks AMa to AMd, respectively. The control unit 17 controls the deformation unit 16 and the substrate driving unit based on the detection results of the detection units 3a to 3d, thereby aligning the complete shot Sc and the mold 2.

Figure 8:
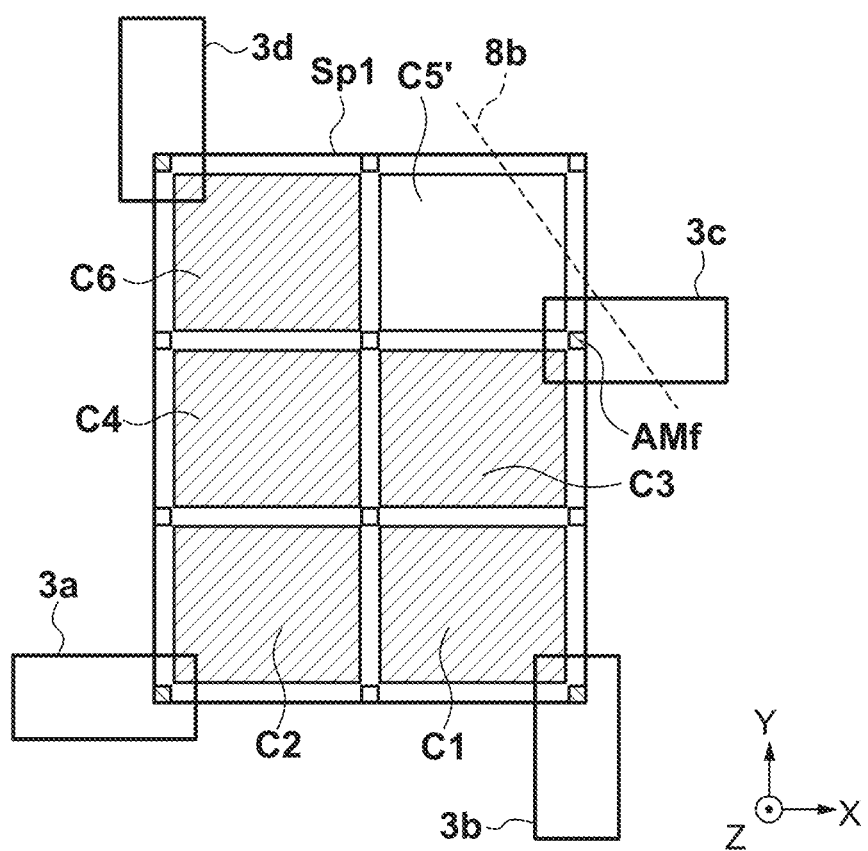
FIG. 8 is a view for explaining alignment between a partial shot and a mold.

FIG. 8 is a view for explaining alignment between the partial shot Sp1 and the mold 2 (pattern portion 2a). In the partial shot Sp1, the chip area C5 includes the periphery 8b of the substrate 8, and the substrate-side mark 11 in the alignment mark AMc is not formed on the substrate. Hence, in the partial shot Sp1, the alignment mark AMf is selected as an alignment mark to be detected by the detection unit 3 in place of the alignment mark AMc. The control unit 17 arranges the detection unit 3c at a position where the selected alignment mark AMf can be detected, and causes the detection unit 3c to detect the alignment mark AMf. The control unit 17 causes the detection units 3a, 3b, and 3d to detect the alignment marks AMa, AMb, and AMd, respectively, as in the complete shot Sc. The control unit 17 controls the deformation unit 16 and the substrate driving unit based on the detection results of the detection units 3a to 3d, thereby aligning the partial shot Sp and the mold 2. Alignment of the partial shot Sp1 has been described above with reference to FIG. 8. In remaining partial shots Spn as well, alignment is performed by the same method.

As described above, in the imprint apparatus 50, the alignment marks to be detected by the detection unit 3 are selected in accordance with the number or positions of chip areas Ci included in the shot region 8a. However, the plurality of substrate-side marks 11 in the shot region 8a may individually have positional shifts due to, for example, manufacturing errors of the mold 2 used in the preceding lithography process, deformation of the substrate-side marks 11 or the substrate 8 caused by a semiconductor process, and the like. The plurality of mold-side marks 10 formed on the mold 2 may also individually have positional shifts due to, for example, manufacturing errors. In this case, when alignment between the shot region 8a and the mold is performed without considering the positional shifts of the substrate-side marks 11 or the positional shifts of the mold-side marks 10, it may be difficult to accurately transfer the pattern of the mold 2 to the shot region 8a. To present this, the imprint apparatus 50 according to the first embodiment performs alignment between the shot region 8a and the mold 2 (pattern portion 2a) in consideration of the positional shifts of the substrate-side marks 11 on the shot region 8a. Alignment in the imprint apparatus 50 according to the first embodiment will be described below with reference to FIG. 9.

FIG. 9 is a view showing the alignment marks AMa to AMh in the shot region 8a. The alignment marks AMa to AMh indicate so-called Box in Box marks in which the substrate-side marks 11 are arranged inside the mold-side marks 10. Referring to FIG. 9, in each of the alignment marks AMa to AMd selected at the time of alignment of the complete shot Sc, the center of the mold-side mark 10 matches the center of the substrate-side mark 11. At this time, assume that the overlay error between the shot region 8a and the pattern of the mold 2 falls within the allowable range. Actually, positional shifts often occur in the alignment marks AMa to AMd as well. However, the above assumption is made for an easy description. On the other hand, the alignment marks AMe to AMh selectable at the time of alignment of the partial shot Sp individually have positional shifts even in a state in which the overlay error between the shot region 8a and the pattern of the mold 2 falls within the allowable range. That is, in each of the alignment marks AMe to AMh, the substrate-side mark 11 and the mold-side mark 10 shift relative to each other. The relative positional shift amounts (X direction, Y direction) in the alignment marks AMe to AMh are $(\Delta Xe, \Delta Ye)$, $(\Delta Xf, \Delta Yf)$, $(\Delta Xg, \Delta Yg)$, and $(\Delta Xh, \Delta Yh)$, respectively, as shown in FIG. 9.

As described above, assume that the overlay error between the shot region 8a and the pattern of the mold 2 falls within the allowable range in the state of the alignment marks AMa to AMh shown in FIG. 9. In this case, at the time of alignment of the complete shot Sc, the overlay error can be made to fall within the allowable range by matching the center of the substrate-side mark 11 with the center of the mold-side mark 10 in each of the alignment marks AMa to AMd. On the other hand, at the time of alignment of, for example, the partial shot Sp1, the alignment mark AMf is used, as shown in FIG. 8. Hence, the control unit 17 controls alignment between the partial shot Sp1 and the mold 2 (pattern portion 2a) such that the substrate-side mark 11 and the mold-side mark 10 shift by the positional shift amount $(\Delta Xf, \Delta Yf)$ in the alignment mark AMf. The overlay error between the partial shot Sp1 and the pattern of the mold can be made to fall within the allowable range by controlling alignment in this way. In the above description, positional shifts occur in the alignment marks AMe to AMh when the overlay error between the shot region 8a and the pattern of the mold 2 falls within the allowable range. In fact, positional shift amounts $(\Delta X, \Delta Y)$ are often generated in all of the alignment marks AMa to AMl.

To do the above-described alignment, the imprint apparatus 50 according to the first embodiment has information representing the positional shift amount generated between each substrate-side mark 11 and a corresponding mold-side mark 10 when the overlay error between the shot region 8a and the pattern of the mold 2 falls within the allowable range. That is, the imprint apparatus according to the first embodiment has, for each alignment mark AM, the positional shift amount (positional shift amount between the substrate-side mark 11 and the mold-side mark 10) in the alignment mark AM. The information is stored in, for example, the memory of the control unit 17.

In the imprint apparatus 50 according to the first embodiment, the control unit 17 selects the substrate-side marks 11 to be detected by the detection unit 3 out of the plurality of substrate-side marks 11 provided in the target shot region 8b in accordance with the number or positions of valid chip areas included in the target shot region 8b. Next, the control unit 17 obtains positional shift amounts corresponding to the selected substrate-side marks 11 from the information representing the positional shift amounts in the respective alignment marks AM. The control unit 17 causes the detection unit 3 to detect the relative positions of the selected substrate-side marks 11 and the mold-side marks 10 corresponding to them, and controls alignment between the target shot region 8b and the mold 2 such that the detected relative positions are shifted by the obtained positional shift amounts. This makes it possible to accurately transfer the pattern of the mold to the target shot region 8b even when the substrate-side marks 11 or mold-side marks 10 individually have positional shifts.

The method of obtaining information representing the positional shift amount in each alignment mark AM will be described here. The information can be obtained using, for example, a transfer result obtained by transferring the pattern of the mold 2 to the complete shot Sc. After the pattern of the mold 2 is transferred to the complete shot Sc, the control unit 17 detects the transferred marks 21 and the substrate-side marks 11 formed in the complete shot Sc using the detection units 3a to 3d. This allows the control unit 17 to obtain the positional shift amount in each alignment mark AM, that is, the positional shift amounts between the substrate-side marks 11 and the mold-side marks 10. Even when the complete shot Sc and the mold 2 are aligned using the alignment marks AMa to AMd, the overlay error between the complete shot Sc and the pattern of the mold 2 may fall outside the allowable range. In this case, since marks to be used to measure the overlay error are normally provided on the shot region 8a and the mold, the control unit 17 measures the overlay error using the marks. The control unit 17 can thus obtain the positional shift amount in each alignment mark AM based on the relative positions of the substrate-side marks and the mold-side marks detected using the detection units 3a to 3d and the measured overlay error. The overlay error may be measured using a measuring unit configured to measure the overlay error and provided in the imprint apparatus 50 or using a device outside the imprint apparatus.

A plurality of complete shots Sc exist in the substrate, as shown in FIG. 4. Hence, the positional shift amounts in the alignment marks AMa to AMl may be obtained for each of the plurality of complete shots Sc, and the average value of the positional shift amounts may be calculated for each alignment mark. The average values of the positional shift amounts can be stored in the imprint apparatus 50 (control unit 17) as the information and updated in every imprint processing of the complete shot Sc. When performing imprint processing for a plurality of substrates 8, the positional shift amounts may be obtained throughout the plurality of substrates 8, instead of obtaining the positional shift amounts in the first substrate 8.

Second Embodiment

In the first embodiment, a method of obtaining the positional shift amount in each alignment mark using Box in Box marks as alignment marks has been described. In the second embodiment, a method of obtaining the positional shift amount in an alignment mark using grating patterns as alignment marks will be described.

Figure 10:
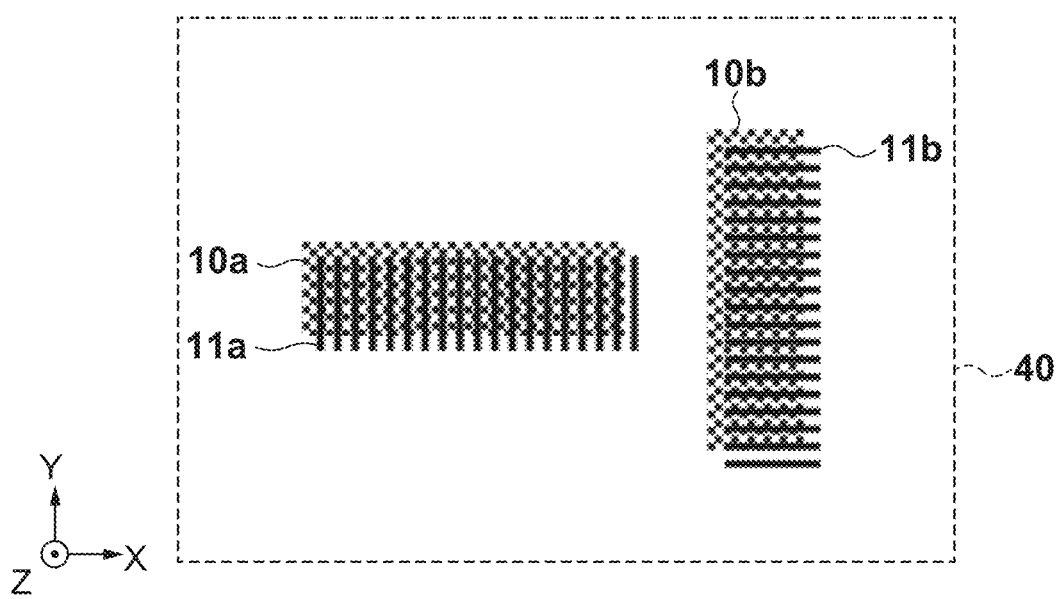
FIG. 10 is a view showing alignment marks according to the second embodiment.

FIG. 10 is a view showing alignment marks according to the second embodiment. As shown in FIG. 10, a mold-side mark 10 can include a grating pattern 10a for X direction measurement and a grating pattern 10b for Y direction measurement. A substrate-side mark 11 can include a grating pattern 11a for X direction measurement and a grating pattern 11b for Y direction measurement. In an imprint apparatus 50, a detection unit 3 observes the mold-side marks 10 and the substrate-side marks 11 in an overlaid state. The grating pattern 10a (10b) of the mold-side mark 10 and the grating pattern 11a (11b) of the substrate-side mark 11 are configured to have slightly different intervals. For this reason, when the detection unit 3 observes diffracted light in a state in which the grating pattern 10a (10b) of the mold-side mark is overlaid on the grating pattern 11a (11b) of the substrate-side mark, a moiré fringe (moiré image) is obtained. At this time, the phase of the moiré fringe changes depending on the relative positions of the grating patterns. For this reason, the relative positions of the substrate-side mark 11 and the mold-side mark 10 can be detected by observing the moiré fringe. As shown in FIG. 10, the grating patterns (10a and 11a) for X direction measurement and the grating patterns (10b and 11b) for Y direction measurement are simultaneously put in a field 40 of view of the detection unit 3. At this time, moiré fringes for alignment in the X and Y directions can simultaneously be observed, and the relative positions of the substrate-side mark 11 and the mold-side mark 10 in the X and Y directions can be detected from the phases of the moiré fringes.

Figure 11A:
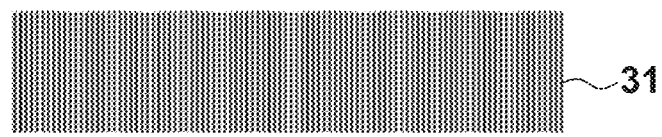
FIG. 11A is a view for explaining a change in the phase of a moiré fringe.
Figure 11B:
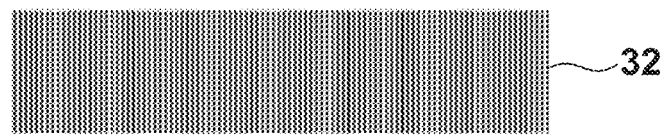
FIG. 11B is a view for explaining a change in the phase of a moiré fringe.
Figure 11C:
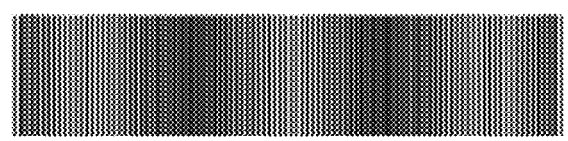
FIG. 11C is a view for explaining a change in the phase of a moiré fringe.
Figure 11D:
FIG. 11D is a view for explaining a change in the phase of a moiré fringe.

A change in the phase of a moiré fringe will be described here with reference to FIGS. 11A to 11D. FIGS. 11A to 11D are views for explaining a change in the phase of a moiré fringe. FIG. 11A shows a grating pattern 31 of the mold-side mark 10. FIG. 11B shows a grating pattern 32 of the substrate-side mark 11. FIGS. 11C and 11D show results obtained by overlaying the grating pattern 31 on the grating pattern 32. As shown in FIGS. 11A and 11B, the grating patterns 31 and 32 are configured to have different intervals. For this reason, when the detection unit 31 is overlaid on the grating pattern 32, a moiré fringe including bright portions and dark portions which are alternately arranged can be generated in accordance with the interval difference, as shown in FIG. 11C. In the moiré fringe, the positions of the bright portions and the dark portions change as the relative positions of the grating patterns 31 and 32 change. For example, when the grating patterns 31 and 32 are relatively shifted in the X direction, the moiré fringe shown in FIG. 11C changes to that shown in FIG. 11D. Since the change in the moiré fringe reflects the change in the relative positions of the grating patterns 31 and 32 in an enlarged pattern, the detection unit 3 can accurately detect the relative positions of the mold-side mark 10 and the substrate-side mark 11 even when the resolution of a projection optical system 12 is low.

Figure 12A:
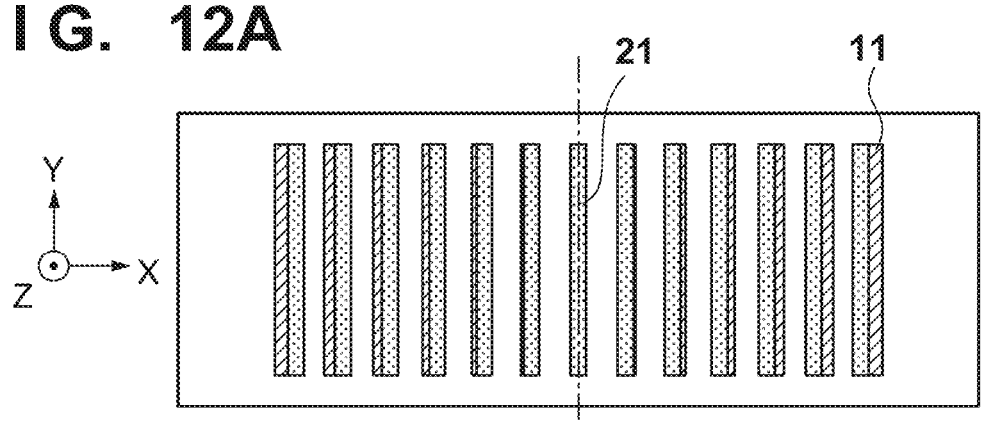
FIG. 12A is a view showing the positional relationship between a transferred mark and a substrate-side mark.
Figure 12B:
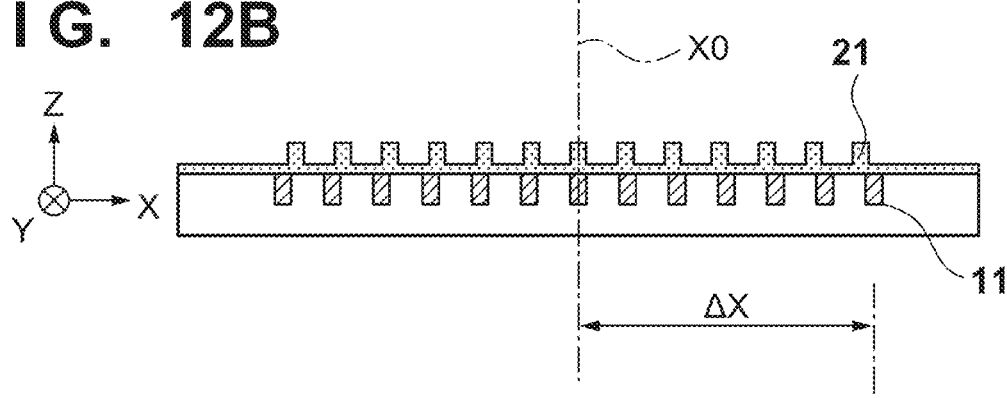
FIG. 12B is a view showing the positional relationship between a transferred mark and a substrate-side mark.
Figure 12C:
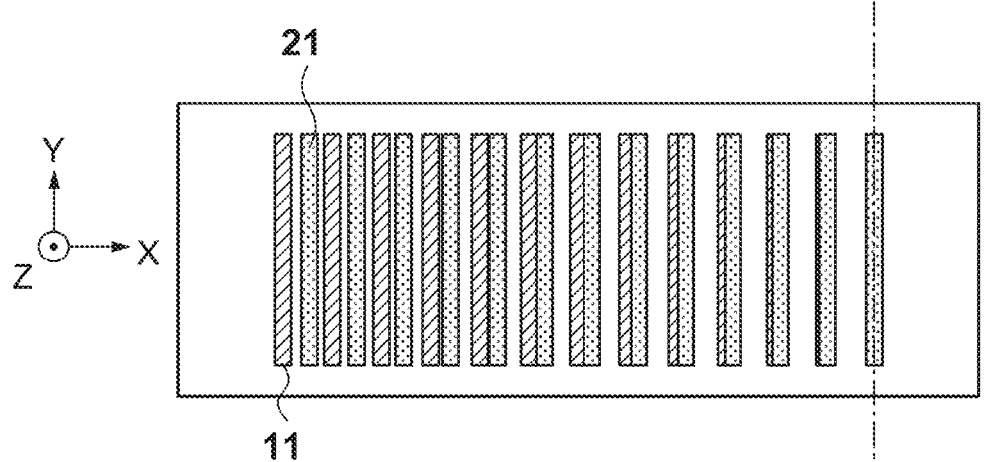
FIG. 12C is a view showing the positional relationship between a transferred mark and a substrate-side mark.
Figure 12D:
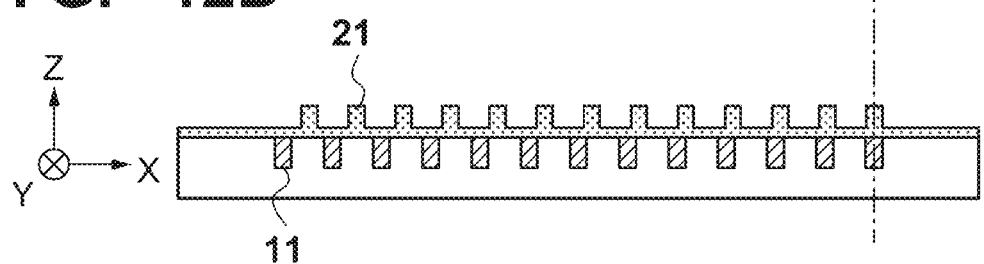
FIG. 12D is a view showing the positional relationship between a transferred mark and a substrate-side mark.

A method of detecting the relative positions of the mold-side mark 10 and the substrate-side mark 11 using a transferred mark 21 formed by transferring the mold-side mark 10 to the shot region will be described next. FIGS. 12A to 12D are views showing the positional relationship between the transferred mark 21 and the substrate-side mark 11. In FIGS. 12A and 12B, the transferred mark 21 is formed on the substrate-side mark 11 in a state in which the center of the transferred mark 21 is placed on the center of the substrate-side mark 11. FIG. 12A is a view showing the substrate-side mark 11 and the transferred mark 21 viewed from the Z direction. FIG. 12B is a sectional view (X-Z sectional view). In the transferred mark 21 formed in this way, a moiré fringe having a symmetric phase with respect to a center X0 of the transferred mark 21 is observed by the detection unit 3. On the other hand, in FIGS. 12C and 12D, the transferred mark 21 is formed on the substrate-side mark while being shifted. FIG. 12C is a view showing the substrate-side mark 11 and the transferred mark 21 viewed from the Z direction. FIG. 12D is a sectional view (X-Z sectional view). In the transferred mark 21 formed in this way, a moiré fringe having a phase whose peak is located at a position shifted from X0 by ΔX is observed by the detection unit 3. It is therefore possible to detect the positional shift amount between the transferred mark 21 and the substrate-side mark 11, that is, the positional shift amount between the mold-side mark 10 and the substrate-side mark 11 by observing the moiré fringe.

The step of detecting the positional shift amount between the mold-side mark 10 and the substrate-side mark 11 using the transferred mark 21 is executed for each of alignment marks AMa to AMl in a complete shot Sc. More specifically, in the imprint apparatus 50, when transfer of the pattern of a mold 2 to the complete shot Sc ends, and the mold 2 is separated from the complete shot Sc, detection units 3a to 3d observe the transferred marks 21. The imprint apparatus 50 can detect the positional shift amounts between the mold-side mark 10 and the substrate-side mark 11 based on the phase of the moiré fringe obtained from the transferred mark 21 and the substrate-side mark 11. When detecting the positional shift amount, the overlay error between the complete shot Sc and the pattern of the mold 2 to be transferred on it may be taken into consideration.

Third Embodiment

In the third embodiment, another method of obtaining the positional shift amount in an alignment mark using grating patterns as alignment marks will be described.

Figures 13A, 13B, 13C, 14A, 14B, 14C:
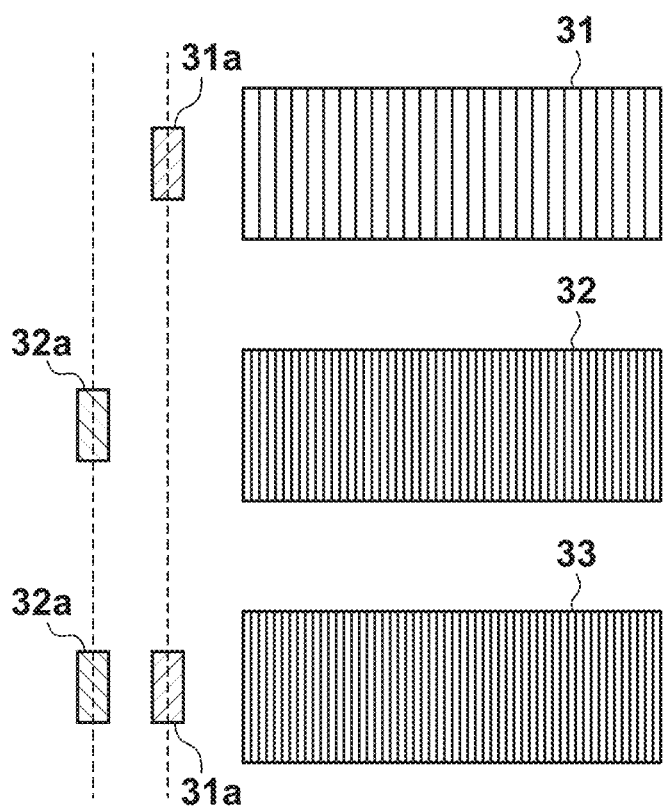
FIG. 13A is a view showing an alignment mark according to the third embodiment.
FIG. 13B is a view showing an alignment mark according to the third embodiment.
FIG. 13C is a view showing alignment marks according to the third embodiment.
FIG. 14A is a view showing alignment marks according to the third embodiment.
FIG. 14B is a view showing alignment marks according to the third embodiment.
FIG. 14C is a view showing alignment marks according to the third embodiment.

FIGS. 13A to 13C are views showing alignment marks according to the third embodiment. FIG. 13A shows a mold-side mark 10. FIG. 13B shows a substrate-side mark 11. FIG. 13C shows a result of overlaying the mold-side mark 10 on the substrate-side mark 11. The mold-side mark 10 includes a grating pattern 31, and a confirmation pattern 31a (coarse detection mark) used to confirm the position of the grating pattern 31. The substrate-side mark 11 includes a grating pattern 32 having an interval different from that of the grating pattern 31 of the mold-side mark 10, and a confirmation pattern 32a used to confirm the position of the grating pattern 32. Each of the grating patterns 31 and 32 is configured to have a predetermined period. For this reason, a moiré fringe formed when the relative positions of the grating patterns 31 and 32 shift by an integer multiple of the period is the same as that before the shift of the relative positions. That is, when the relative positions of the mold-side mark 10 and the substrate-side mark 11 are detected based on only the moiré fringe formed by the grating patterns 31 and 32, an error may occur in the detection result. Hence, it is important to set the relative positions of the grating patterns 31 and 32 within one period. For this purpose, the mold-side mark 10 and the substrate-side mark 11 according to the third embodiment include the confirmation patterns 31a and 32a, respectively. The confirmation patterns 31a and 32a are configured to have a detection range wider than that of the moiré fringe, although the detection accuracy is lower than that of the moiré fringe. When the confirmation patterns 31a and 32a having such a structure are detected by the detection unit 3, the relative positions of the grating patterns 31 and 32 can be set within one period, and the relative positions of the mold-side mark 10 and the substrate-side mark 11 can accurately be detected.

When the relative positions of the confirmation pattern 31a (32a) and the grating pattern (32) equal the design values, the relative positions of the mold-side mark 10 and the substrate-side mark 11 can accurately be detected by the above-described method. However, the relative positions of the confirmation pattern 31a (32a) and the grating pattern (32) may have a deviation from the design values due to manufacturing errors of the mold 2, or the like. This state will be described with reference to FIGS. 14A to 14C. FIG. 14A is a view showing the arrangement of the grating pattern 31 and the confirmation pattern 31a of the substrate-side mark 11 viewed from the Z direction. FIG. 14B is a sectional view. In FIG. 14B, the grating pattern 31 includes a plurality of marks 31b arranged at a predetermined interval with respect to a mark 31d as the center. The confirmation pattern 31a is assumed to be arranged as designed with respect to the grating pattern 31. On the other hand, in FIG. 14C, a confirmation pattern 31a' is formed at a position shifted from the design value by a shift amount Δ with respect to the grating pattern 31. When the shift amount Δ is equal to or larger than a ½ period, it is difficult to accurately detect the relative positions of the mold-side mark 10 and the substrate-side mark 11. Hence, the shift amount Δ is measured in advance in or outside an imprint apparatus 50, and alignment of the confirmation pattern 31a is performed in consideration of the shift amount A. This makes it possible to accurately detect the relative positions of the mold-side mark 10 and the substrate-side mark 11.

In the third embodiment, a method has been described in which the detection unit 3 detects the confirmation patterns 31a and 32a, thereby setting the relative positions of the grating patterns 31 and 32 within one period and detecting the relative positions of the mold-side mark 10 and the substrate-side mark 11. However, the relative positions of the mold-side mark 10 and the substrate-side mark 11 may be detected only by, for example, causing the detection unit 3 to detect the confirmation patterns 31a and 32a.

Fourth Embodiment

In the above-described embodiments, the imprint apparatus 50 has been exemplified. However, the present invention configured to align a shot region 8a and a mold 2 using information representing the positional shift amount in each alignment mark is also applicable to an exposure apparatus (stepper or scanner). In the fourth embodiment, a case where the present invention is applied to an exposure apparatus will be described.

Figure 15A:
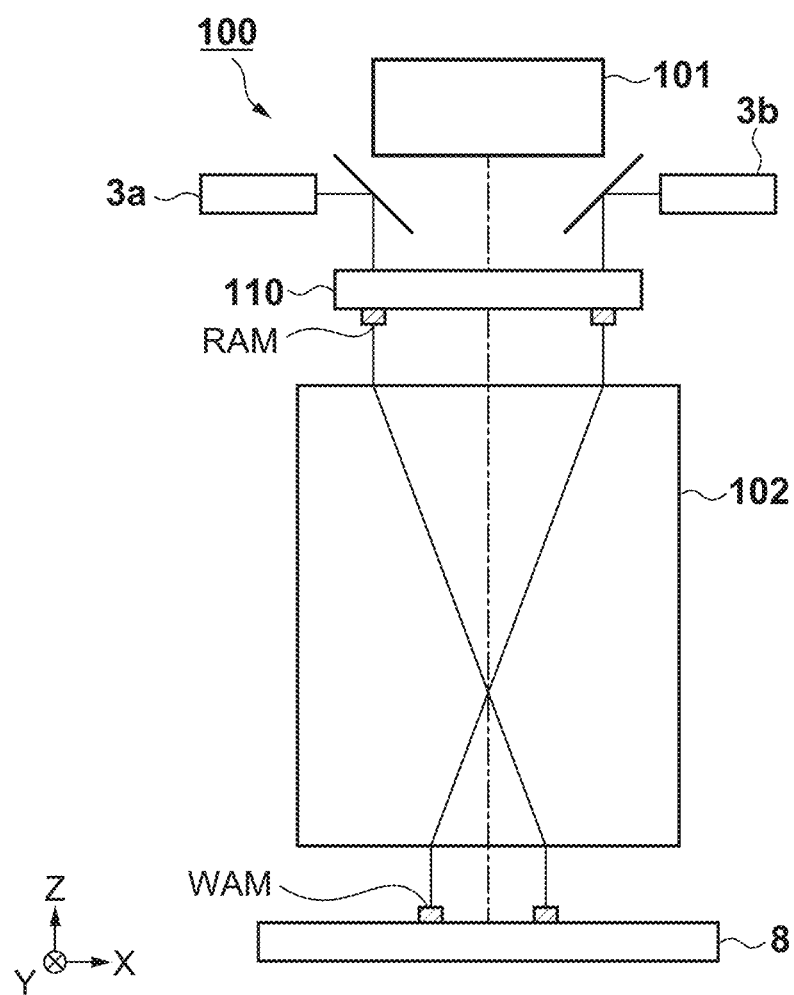
FIG. 15A is a view showing the arrangement of an exposure apparatus according to the fourth embodiment.
Figure 15B:
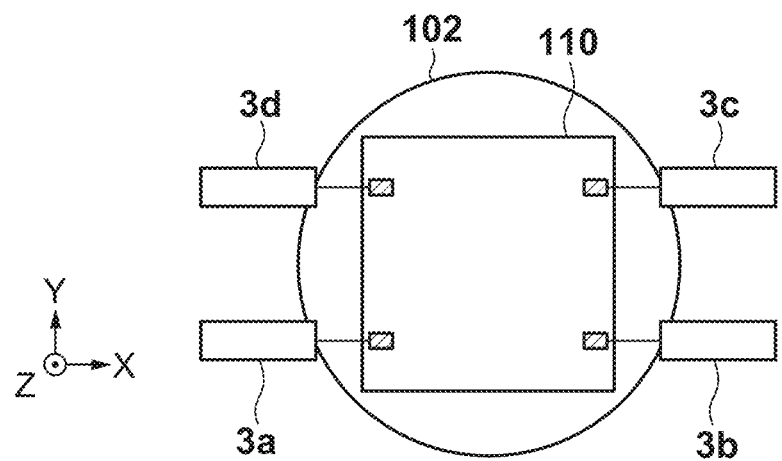
FIG. 15B is a view showing the arrangement of the exposure apparatus according to the fourth embodiment.

FIG. 15A is a view showing the arrangement of an exposure apparatus 100 according to the fourth embodiment. An illumination system 101 illuminates a reticle 110 (original) on which a pattern and alignment marks are formed with exposure light emitted by a light source included in it. A projection optical system 102 has a predetermined magnification (for example, ×1), and projects the pattern formed on the reticle 110 onto a substrate 8. A plurality of alignment marks WAM are formed in a shot region 8a formed on the substrate 8 so as to correspond to a plurality of chip areas Ci included in one shot region 8a. A plurality of alignment marks RAM are formed on the reticle 110 so as to correspond to the plurality of alignment marks WAM formed in one shot region 8a. The alignment marks WAM formed in the shot region 8a will be referred to as substrate-side marks, and the alignment marks RAM formed on the reticle 110 will be referred to as reticle-side marks hereinafter. In the exposure apparatus 100, a plurality of detection units 3 (four detection units 3a to 3d in the fourth embodiment) are arranged between the reticle 110 and the illumination system 101, as shown in FIG. 15B. FIG. 15B is a schematic view showing the detection unit 3 viewed from the upper side of the apparatus. The exposure apparatus 100 causes the detection units 3a to 3d to detect the reticle-side marks and the substrate-side marks via the projection optical system 102, and aligns the shot region 8a and the reticle 110. The alignment is done by, for example, changing the relative positions of the reticle and the substrate or changing the projection magnification of the projection optical system 102.

In the exposure apparatus 100 according to the fourth embodiment as well, the substrate-side marks or reticle-side marks may individually have positional shifts, as in the imprint apparatus 50 according to the first embodiment. To cope with this, the exposure apparatus 100 according to the fourth embodiment has information representing the positional shift amount generated between each substrate-side mark and a corresponding reticle-side mark when the overlay error between the shot region 8a and the reticle 110 falls within an allowable range, as in the first embodiment. In the exposure apparatus 100 according to the fourth embodiment, substrate-side marks to be detected by the detection unit 3 are selected out of the plurality of substrate-side marks provided in the shot region 8a in accordance with the number or positions of valid chip areas included in the shot region 8a. Next, positional shift amounts corresponding to the selected substrate-side marks are obtained from the information representing the positional shift amounts in the respective alignment marks. The detection unit 3 detects the relative positions of the selected substrate-side marks and the reticle-side marks corresponding to them, and alignment between the shot region 8a and the reticle 110 is controlled such that the detected relative positions are shifted by the obtained positional shift amounts. This makes it possible to accurately transfer the pattern of the reticle 110 to the shot region 8a even when the substrate-side marks or reticle-side marks individually have positional shifts.

In the exposure apparatus according to the fourth embodiment, the method of aligning the shot region and the pattern of the reticle is not limited to the die-by-die alignment method, and may be a global alignment method. The global alignment method means global alignment that measures alignment marks in shot regions (sample shot regions) at several points on a substrate and statistically processes the measured values. For example, the present invention is applicable when detecting alignment marks in a sample shot region.

Embodiment of Method of Manufacturing Article

A method of manufacturing an article according to the embodiment of the present invention is suitable for manufacturing an article, for example, a microdevice such as a semiconductor device or an element having a fine structure. The method of manufacturing an article according to this embodiment includes a step of transferring the pattern of an original (mold or reticle) onto a substrate using the above-described lithography apparatus (imprint apparatus or exposure apparatus), and a step of processing the substrate to which the pattern is transferred in the above step. The manufacturing method also includes other known processes (for example, oxidation, deposition, vapor deposition, doping, planarization, etching, resist removal, dicing, bonding, and packaging). The method of manufacturing an article according to this embodiment is advantageous in at least one of the performance, quality, productivity, and production cost of the article, as compared to conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-168334 filed on Aug. 13, 2013, which is hereby incorporated by reference herein in its entirety.

What is claimed is:

1. A lithography apparatus for transferring a pattern formed on an original to each of a plurality of shot regions on a substrate, the lithography apparatus comprising:
a detection unit configured to detect a mark provided in a target shot region to which the pattern of the original is to be transferred and a mark provided on the original; and
a control unit configured to:
control alignment between the target shot region and the pattern of the original based on a detection result of the detection unit;
generate information representing a positional shift amount between a mark in a shot region and a corresponding mark on the original, based on an overlay error on a sampled shot region different from the target shot region, and relative positions between substrate-side marks and original-side marks, when the pattern of the original was transferred to the sampled shot region;
determine, based on the information, a positional shift amount with respect to each mark to be detected by the detection unit out of a plurality of marks provided in the target shot region; and
control alignment between the target shot region and the pattern of the original so that the mark in the target shot region detected by the detection unit and the corresponding mark on the original are shifted by the determined positional shift amount.

2. The apparatus according to claim 1, wherein the control unit generates the information using a transfer result of the pattern of the original for, out of the plurality of shot regions, a first shot region formed on the substrate so as to have the same shape of the pattern of the original.

3. The apparatus according to claim 2, wherein the control unit obtains the positional shift amount for the information based on relative positions of each mark in the first shot region and the corresponding mark on the original and an overlay error between the first shot region and the pattern of the original transferred to the first shot region, which is obtained by transferring the pattern of the original to the first shot region at the relative positions, and updates the information in accordance with the positional shift amount.

4. The apparatus according to claim 3, further comprising:
a measuring unit configured to measure the overlay error, wherein the control unit causes the measuring unit to measure the overlay error using the first shot region to which the pattern of the original is transferred, obtains the positional shift amount for the information based on the measured overlay error, and updates the information using the obtained positional shift amount.

5. The apparatus according to claim 3, wherein:
the mark in the shot region and the mark on the original respectively include grating patterns having intervals different from each other, and
the control unit causes the detection unit to detect diffracted light of the grating pattern in the shot region and the grating pattern on the original to obtain the relative positions of each mark in the first shot region and a corresponding mark on the original.

6. The apparatus according to claim 5, wherein:
the mark in the shot region and the mark on the original respectively include confirmation patterns used to detect the relative positions at an accuracy lower than that of the relative positions obtained from the diffracted light, and
the control unit obtains the relative positions based on the diffracted light and a positional relationship between the confirmation pattern in the shot region and the confirmation pattern on the original.

7. The apparatus according to claim 6, wherein each of the mark in the shot region and the mark on the original includes the grating pattern and the confirmation pattern, and the positional shift amount is obtained based on relative position errors of the grating patterns and the confirmation patterns.

8. The apparatus according to claim 3, wherein:
the mark in the shot region and the mark on the original respectively include grating patterns having intervals different from each other and confirmation patterns used to detect the relative positions at an accuracy lower than that of the relative positions obtained by the grating patterns, and
the control unit obtains the relative positions based on a positional relationship between the confirmation pattern in the shot region and the confirmation pattern on the original.

9. The apparatus according to claim 1, wherein:
the plurality of shot regions include a second shot region including at least one chip area and arranged on a peripheral portion of the substrate so as to be partially lost while including a periphery of the substrate, and
when the second shot region is the target shot region, the control unit causes the detection unit to detect a mark provided for the at least one chip area out of a plurality of marks formed in the second shot region.

10. The apparatus according to claim 1, wherein:
the mark in the shot region and the mark on the original respectively include grating patterns having intervals different from each other, and
the control unit causes the detection unit to detect diffracted light of the grating pattern in the shot region and the grating pattern on the original, thereby obtaining the positional shift amount.

11. A method of manufacturing an article, the method comprising the steps of:
transferring a pattern of an original onto a substrate using a lithography apparatus; and
processing the substrate on which a pattern has been formed,
wherein the lithography apparatus transfers the pattern formed on the original to each of a plurality of shot regions on the substrate, and includes:
a detection unit configured to detect a mark provided in a target shot region to which the pattern of the original is to be transferred and a mark provided on the original; and
a control unit configured to:
control alignment between the target shot region and the pattern of the original based on a detection result of the detection unit;
generate information representing a positional shift amount between a mark in a shot region and a corresponding mark on the original and the pattern of the original, based on an overlay error on a sampled shot region different from the target shot region, and relative positions between substrate-side marks and original-side marks, when the pattern of the original was transferred to the sampled shot region;
determine, based on the information, a positional shift amount with respect to each mark to be detected by the detection unit out of a plurality of marks provided in the target shot region; and
control alignment between the target shot region and the pattern of the original so that the mark in the target shot region detected by the detection unit and the corresponding mark on the original are shifted by the determined positional shift amount.

12. A method of aligning a shot region and an original in a lithography apparatus for transferring a pattern formed on the original to each of a plurality of shot regions on a substrate, the lithography apparatus including a detection unit configured to detect a mark provided in a target shot region to which the pattern of the original is to be transferred and a mark provided on the original, the alignment method comprising:
a generating step of generating information representing a positional shift amount between a mark in a shot region and a corresponding mark on the original, based on an overlay error on a sampled shot region different from the target shot region, and relative positions between substrate-side marks and original-side marks, when the pattern of the original was transferred to the sampled shot region;
a determining step of determining, based on the information, a positional shift amount with respect to each mark to be detected by the detection unit out of a plurality of marks provided in the target shot region; and
a control step of controlling alignment between the target shot region and the pattern of the original so that the mark in the target shot region detected by the detection unit and the corresponding mark on the original corresponding to the mark are shifted by the determined positional shift amount.

\* \* \* \* \*